(12) United States Patent
Martin et al.

(10) Patent No.: US 8,580,655 B2
(45) Date of Patent: Nov. 12, 2013

(54) PROCESSING METHOD FOR BUMP-INCLUDED DEVICE WAFER

(75) Inventors: Devin Martin, Santa Clara, CA (US); Mark Brown, Santa Clara, CA (US)

(73) Assignee: Disco Corporation, Tokyo (JP)

( * ) Notice: Subject to any disclaimer, the term of this patent is extended or adjusted under 35 U.S.C. 154(b) by 36 days.

(21) Appl. No.: 13/410,794

(22) Filed: Mar. 2, 2012

(65) Prior Publication Data
US 2013/0230966 A1    Sep. 5, 2013

(51) Int. Cl.
*H01L 21/46* (2006.01)
(52) U.S. Cl.
USPC .................. 438/459; 438/455; 257/E23.02
(58) Field of Classification Search
None
See application file for complete search history.

(56) References Cited

U.S. PATENT DOCUMENTS

| | | | |
|---|---|---|---|
| 6,949,158 B2 | 9/2005 | Ball et al. | |
| 7,348,275 B2 | 3/2008 | Sekiya | |
| 8,461,019 B2 | 6/2013 | Martin et al. | |
| 2003/0003688 A1 | 1/2003 | Tandy et al. | |
| 2005/0064681 A1 | 3/2005 | Wood et al. | |
| 2011/0097874 A1 | 4/2011 | Broekaart et al. | |
| 2013/0023107 A1* | 1/2013 | Martin et al. | 438/458 |

FOREIGN PATENT DOCUMENTS

| | | | | |
|---|---|---|---|---|
| JP | 2004-207606 | | 7/2004 | |
| JP | 2011-067888 | * | 4/2011 | B23Q 3/08 |

* cited by examiner

*Primary Examiner* — Zandra Smith
*Assistant Examiner* — Pamela E Perkins
(74) *Attorney, Agent, or Firm* — Greer, Burns & Crain Ltd.

(57) ABSTRACT

A processing method for a bump-included device wafer which includes an adhesive providing step of providing an adhesive in an annular groove of a carrier wafer so that the adhesive projects from the upper surface of an annular projection of the carrier wafer; a wafer attaching step of attaching and fixing the front side of the device wafer through the adhesive to the front side of the carrier wafer so as to accommodate bumps in a recess of the carrier wafer after performing the adhesive providing step; and a thickness reducing step of grinding or polishing the back side of the device wafer to reduce the thickness of the device wafer to a predetermined thickness after performing the wafer attaching step.

2 Claims, 13 Drawing Sheets

PROCESSING METHOD FOR BUMP-INCLUDED DEVICE WAFER

BACKGROUND OF THE INVENTION

1. Field of the Invention

The present invention relates to a processing method for a semiconductor device wafer, and more particularly to a technique of facilitating the handling of a semiconductor device wafer reduced in thickness.

2. Description of the Related Art

In processing a wafer having a plurality of devices on the front side, such as a semiconductor device wafer and an optical device wafer, the back side of the wafer is ground to reduce the thickness of the wafer to 50 µm or less, for example.

When the thickness of the wafer is reduced to 50 µm or less, the handling of the wafer becomes more greatly difficult as compared with the case that the thickness is larger. For example, there arises a problem such that chipping occurs on the outer circumference of the wafer or the rigidity of the wafer is remarkably reduced.

As a technique to cope with this problem, it is known that the back side of the wafer is ground in the condition where the front side (device formed side) of the wafer is attached through an adhesive or the like to the front side of a carrier wafer (which is also referred to as a support wafer or a support plate) formed of glass or silicon.

SUMMARY OF THE INVENTION

However, in a bump-included device wafer as a semiconductor device wafer having a plurality of bumps on the front side, there is a problem such that the adhesive may enter the minute pits produced due to the bumps in attaching the device wafer to the carrier wafer and that it is very difficult to completely remove the adhesive from the minute pits after separating the device wafer from the carrier wafer. Further, there is a possibility of device failure due to the residual adhesive left in the minute pits.

Further, the bump-included device wafer has a device area where devices are formed and a peripheral marginal area where no devices are formed. The bumps are formed in the device area and are not formed in the peripheral marginal area, so that the height of the device wafer (the height based on the back side of the device wafer) is different between the device area and the peripheral marginal area.

Accordingly, in grinding the back side of the device wafer to reduce the thickness thereof in the condition where the device wafer is held on a holding table, the peripheral marginal area of the device wafer may float from the holding table unless it is held from the lower side, causing a possibility of damage to the device wafer.

The present invention has been made in consideration of the above-mentioned circumstances. It is therefore an object of the present invention to provide a processing method for a bump-included device wafer which can reduce the thickness of the device wafer without damage thereto and can prevent device failure due to the deposition of adhesive in the pits produced due to the bumps.

In accordance with an aspect of the present invention, there is provided a processing method for a bump-included device wafer having a device area where a plurality of devices are formed and a peripheral marginal area surrounding the device area, the devices being respectively formed in a plurality of regions partitioned by a plurality of crossing division lines formed on the front side of the device wafer, each device having a plurality of bumps, the processing method including: a carrier wafer preparing step of preparing a carrier wafer for supporting the front side of the device wafer, wherein the carrier wafer includes a recess formed in an area corresponding to the device area of the device wafer and having a depth corresponding to the height of each bump, and further includes an annular projection formed in the remaining area corresponding to the peripheral marginal area of the device wafer so as to surround the recess, the upper surface of the annular projection being formed with an annular groove; an adhesive providing step of providing an adhesive in the annular groove of the carrier wafer so that the adhesive projects from the upper surface of the annular projection after performing the carrier wafer preparing step; a wafer attaching step of attaching and fixing the front side of the device wafer through the adhesive to the front side of the carrier wafer so as to accommodate the bumps in the recess of the carrier wafer after performing the adhesive providing step; and a thickness reducing step of grinding or polishing the back side of the device wafer to reduce the thickness of the device wafer to a predetermined thickness after performing the wafer attaching step.

Only the peripheral marginal area of the device wafer is attached through the adhesive to the carrier wafer. Accordingly, the adhesive is not deposited to the devices and the bumps, thereby eliminating the need for removal of the adhesive and any troubles such as device failure due to the residual adhesive.

Further, the recess is formed on the front side of the carrier wafer in its central area corresponding to the device area of the device wafer. Accordingly, in grinding the back side of the device wafer to reduce the thickness of the device wafer, the bumps are accommodated in the recess of the carrier wafer, and the peripheral marginal area is supported on the annular projection of the carrier wafer, thereby preventing damage to the device wafer.

Preferably, the processing method for the bump-included device wafer further includes a separating step of cutting the device wafer along a portion thereof corresponding to a boundary area between the inner circumference of the annular groove of the carrier wafer and the outer circumference of the recess of the carrier wafer by using a cutting blade, thereby separating the device area of the device wafer from the carrier wafer after performing the thickness reducing step.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
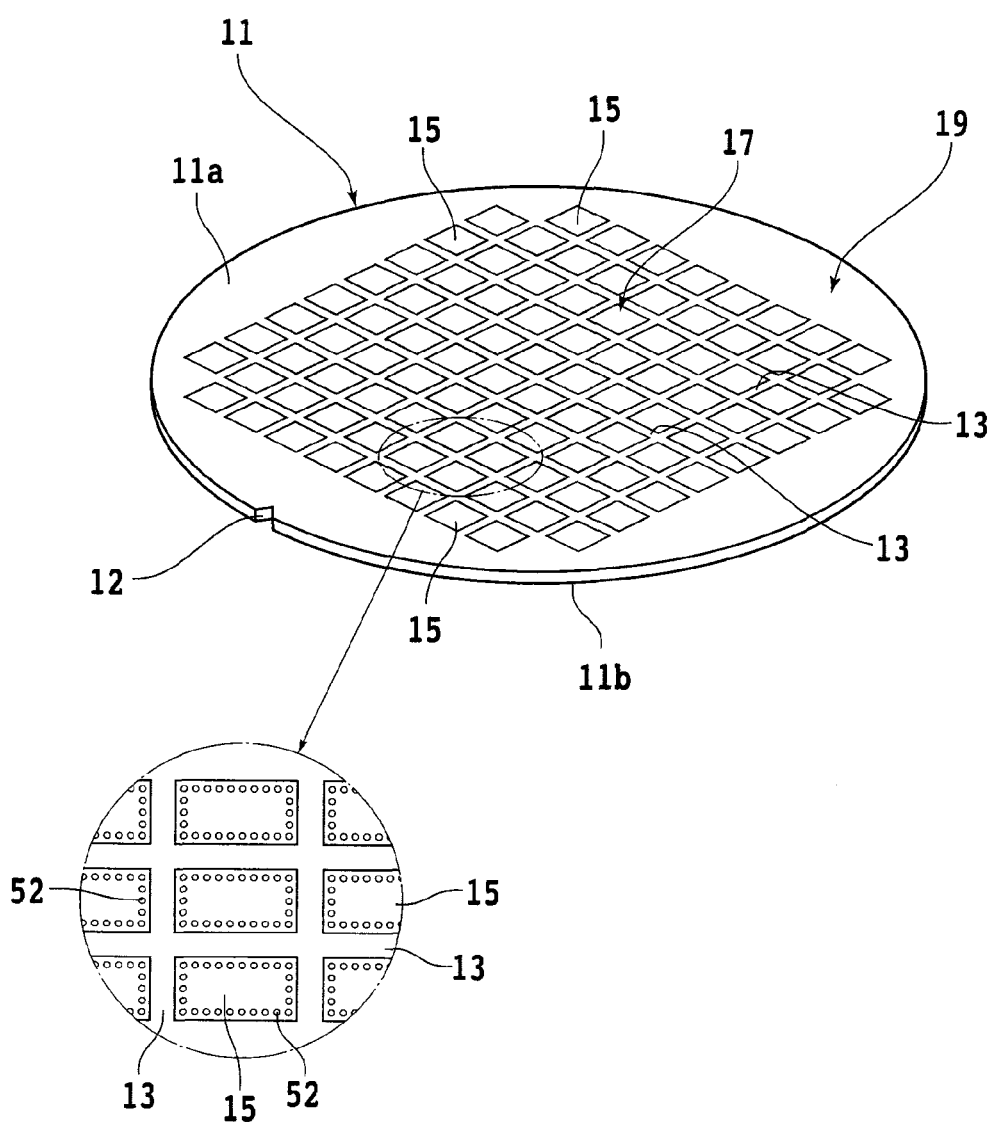
FIG. 1 is a perspective view of a device wafer.

A preferred embodiment of the present invention will now be described in detail with reference to the drawings. FIG. 1 shows a device wafer 11 (which will be also referred to simply as "wafer 11"). The device wafer 11 is formed of a silicon wafer having a thickness of 700 µm, for example. The device wafer 11 has a front side 11a on which a plurality of crossing division lines (streets) 13 are formed to thereby partition the front side 11a into a plurality of regions where a plurality of devices 15 are respectively formed.

The wafer 11 thus configured has a device area 17 where the devices 15 are formed and a peripheral marginal area 19 surrounding the device area 17. The outer circumference of the wafer 11 is formed with a notch 12 as a mark for indicating the crystal orientation of the silicon wafer. As shown in an enlarged (encircled) part of FIG. 1, a plurality of projecting (ball-shaped) bumps 52 are formed on each device 15 along the four sides thereof. The bumps 52 are arranged so as to project from the front side of each device 15, so that the height of the device area 17 is larger than the height of the peripheral marginal area 19.

Thus, the wafer 11 to be processed in the present invention is configured as a bump-included device wafer having the device area 17 where the devices 15 are formed and the peripheral marginal area 19 surrounding the device area 17, the devices 15 being respectively formed in the plural regions partitioned by the plural crossing division lines 13 formed on the front side of the wafer, and each device 15 having the plural bumps 52.

Figure 2:
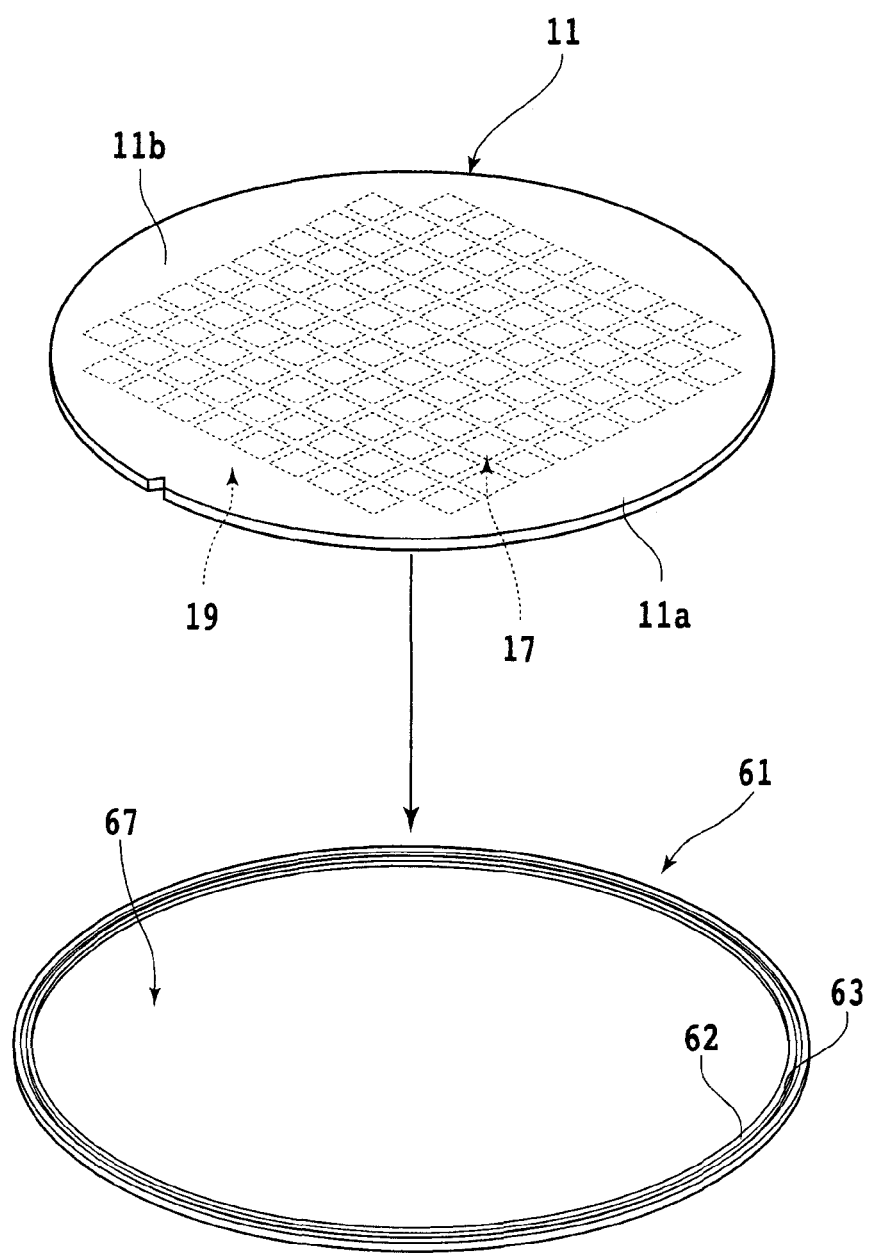
FIG. 2 is a perspective view for illustrating a carrier wafer preparing step of preparing a carrier wafer for supporting the front side of the device wafer.

In the processing method for the device wafer according to the present invention, a carrier wafer preparing step of preparing a carrier wafer 61 as shown in FIG. 2 is first performed to prevent the occurrence of troubles due to chipping of the wafer 11 and a reduction in rigidity of the wafer 11 in a thickness reducing step to be hereinafter described wherein the thickness of the wafer 11 is reduced to 50 µm or less, for example. The carrier wafer 61 is configured by a disk-shaped member, and it functions to support the front side 11a of the wafer 11 in its upside-down condition. The carrier wafer 61 is formed of silicon, glass, ceramics, metal (e.g., stainless steel), or synthetic resin, for example, and it has a configuration capable of stably supporting the wafer 11 even reduced in thickness to 50 µm or less, for example, in the thickness reducing step to be described later.

Figure 3:
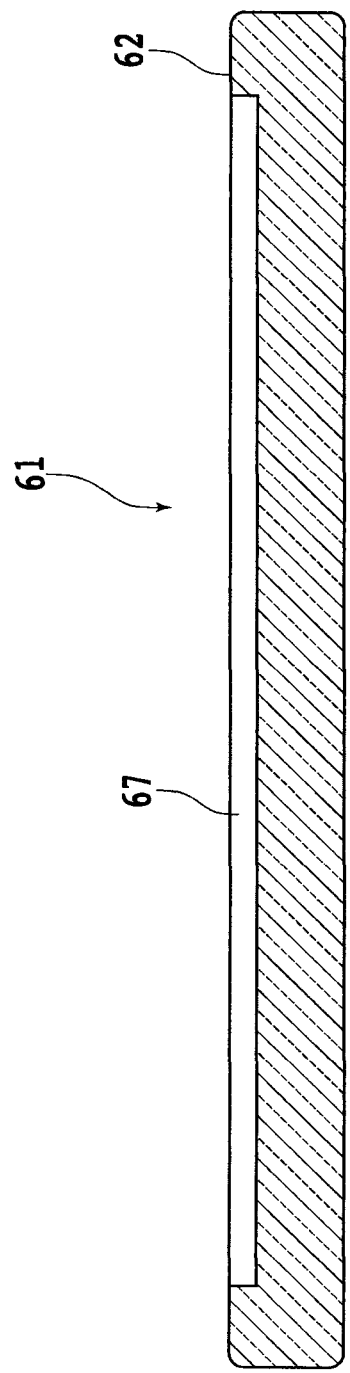
FIG. 3 is a sectional view showing a recess formed on the front side of the carrier wafer.
Figure 4:
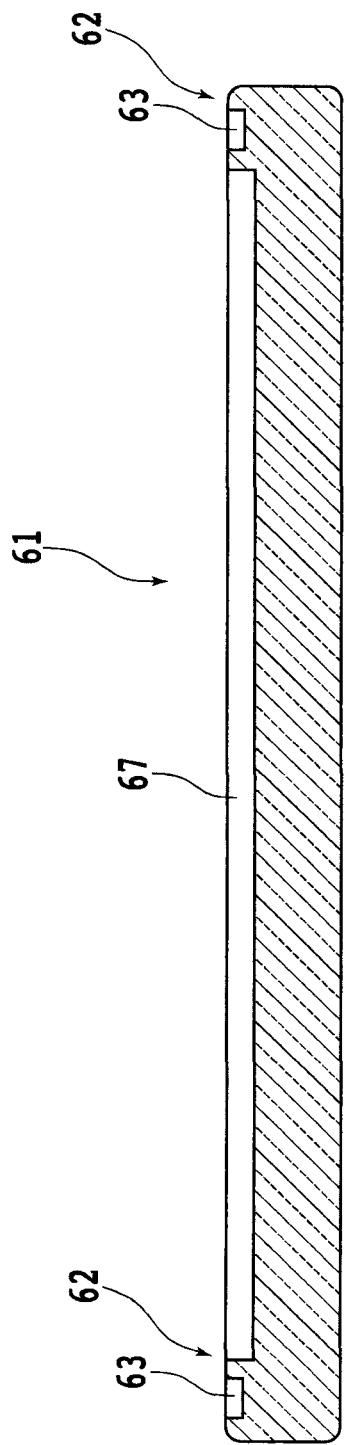
FIG. 4 is a sectional view showing an annular groove formed on the front side of the carrier wafer around the recess.
Figure 9:
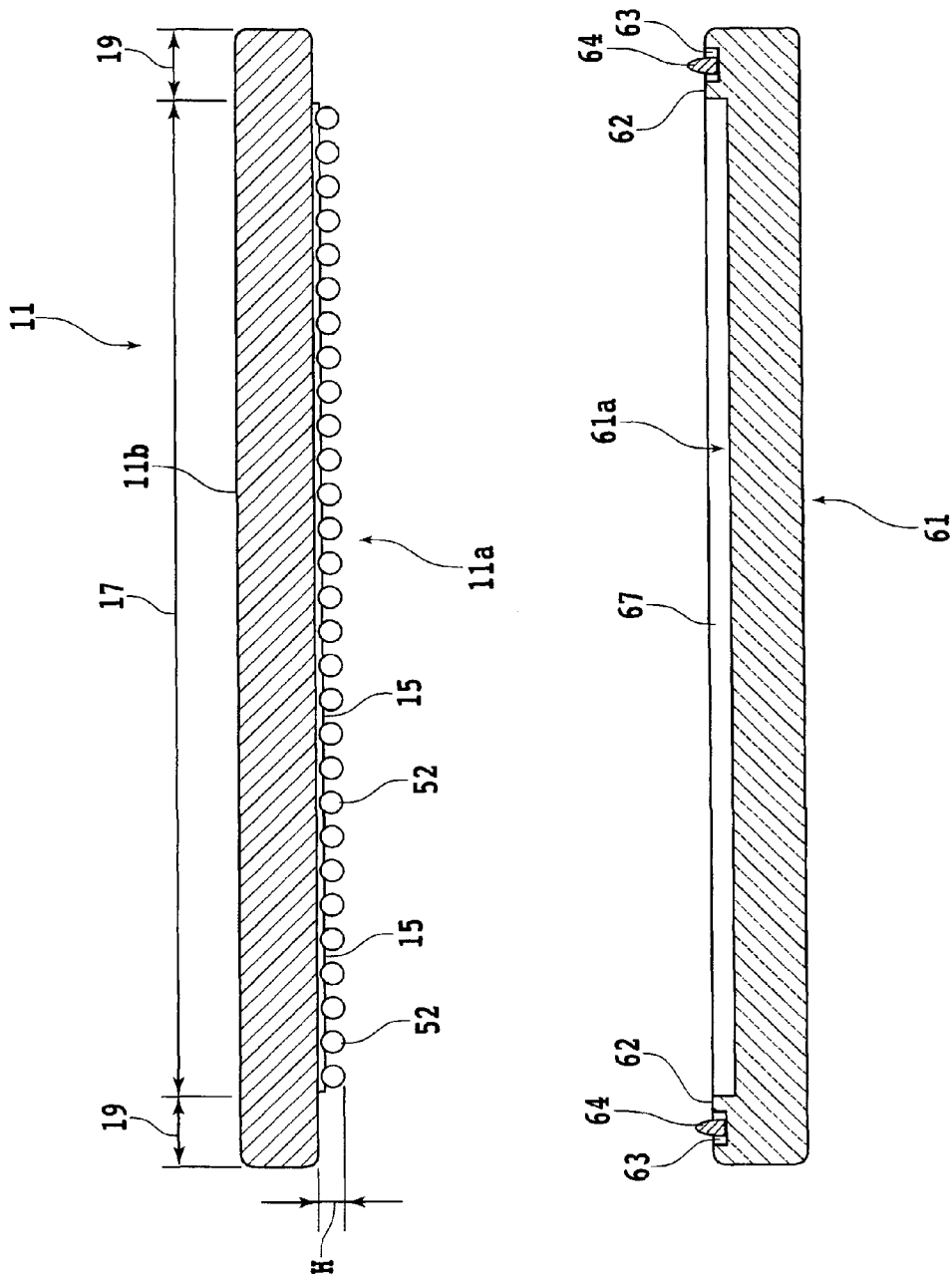
FIG. 9 is a sectional view for illustrating a wafer attaching step.

As shown in FIG. 3, the carrier wafer 61 is formed with a recess 67 in an area corresponding to the device area 17 of the device wafer 11, the recess 67 having a depth corresponding to the height H of each bump 52 (see FIG. 9). This recess 67 may be formed by using a turning apparatus (not shown) to cut the central portion of the carrier wafer 61 and its periphery. By forming the recess 67, an annular projection 62 is formed in the remaining area corresponding to the peripheral marginal area 19 of the device wafer 11 so as to surround the recess 67. As shown in FIG. 4, the upper surface of the annular projection 62 thus configured is cut to form an annular groove 63. This annular groove 63 may be formed by using a cutting apparatus 30 shown in FIG. 5, for example.

Figure 5:
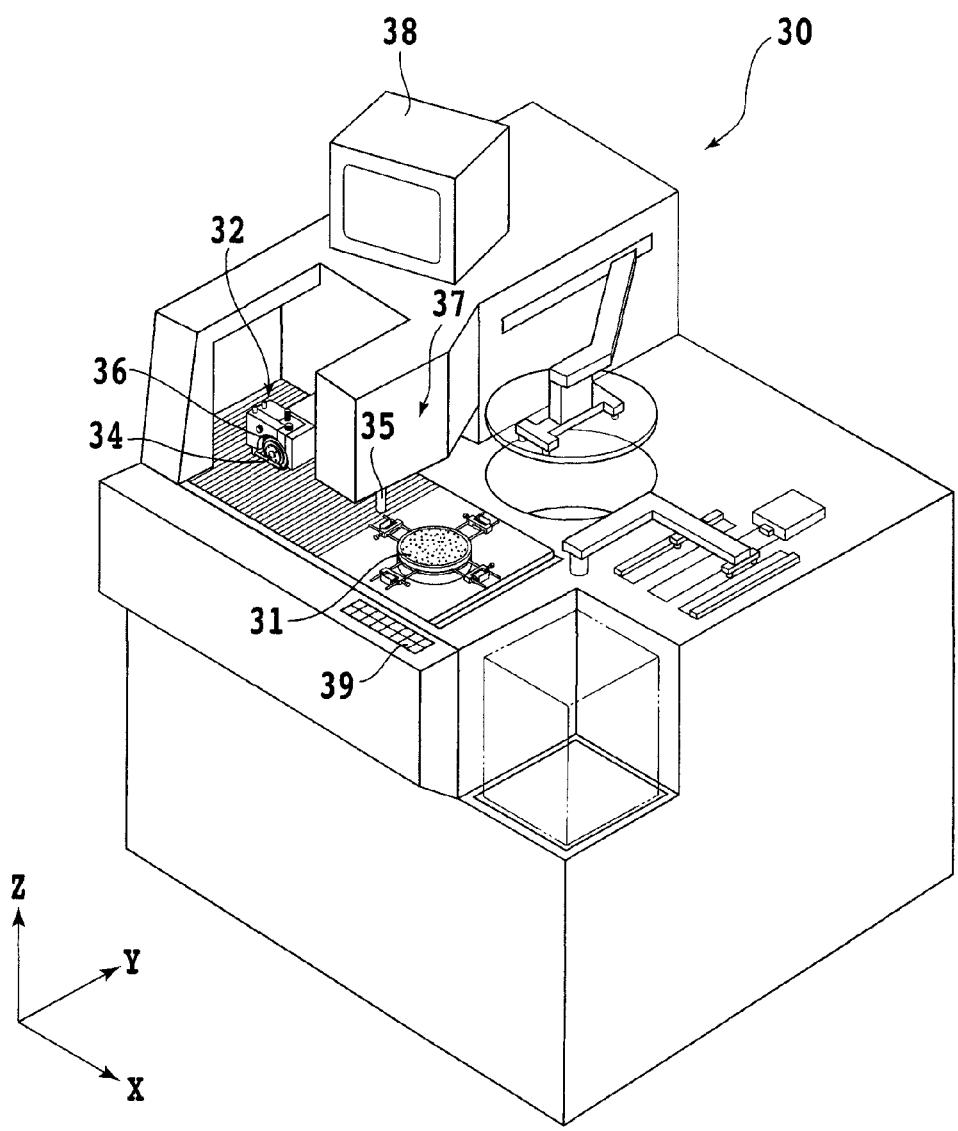
FIG. 5 is a perspective view of a cutting apparatus as a whole.
Figure 6:
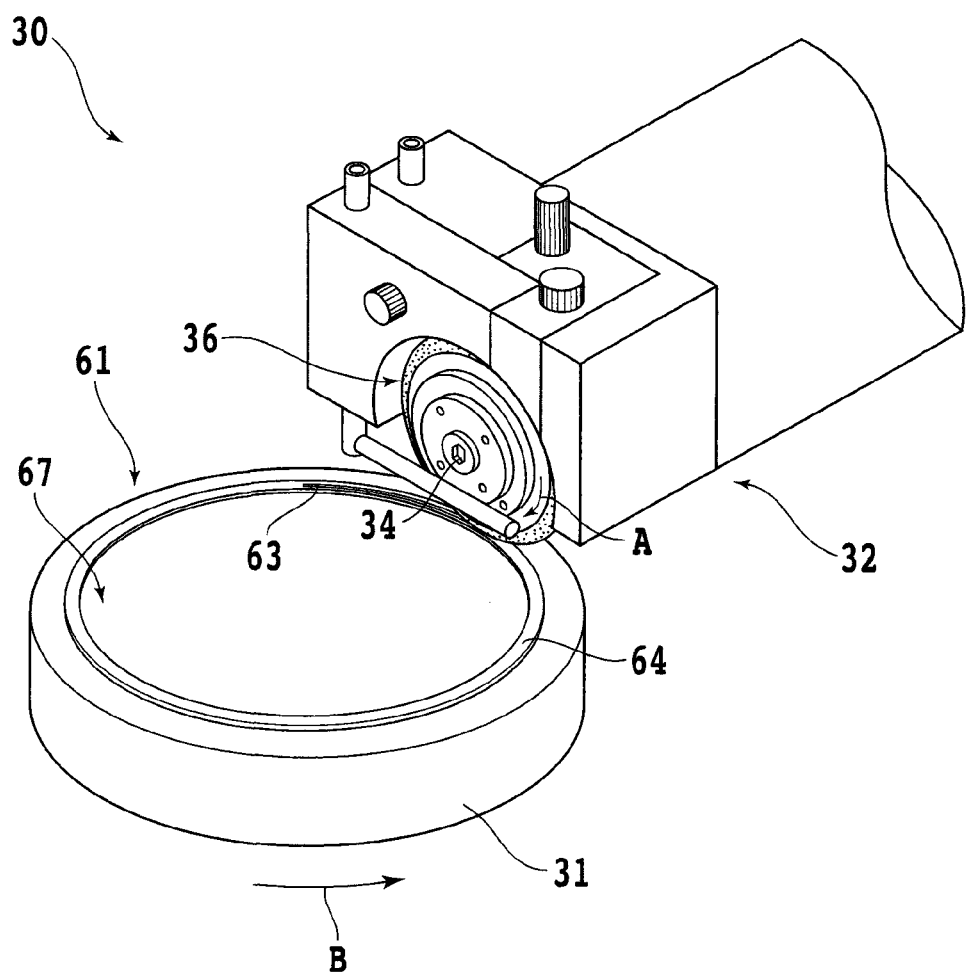
FIG. 6 is a perspective view for illustrating the formation of the annular groove of the carrier wafer by the cutting apparatus.

As shown in FIG. 5, the cutting apparatus 30 includes a chuck table 31 rotatable and reciprocatable in the X direction, and a cutting unit 32 reciprocatable in the Y direction and the Z direction. As shown in FIG. 6, the cutting unit 32 includes a spindle 34 and a cutting blade 36 mounted on the front end of the spindle 34. The cutting blade 36 is rotated by a motor (not shown) at high speeds in the direction shown by an arrow A. The chuck table 31 has an upper surface for holding the carrier wafer 61 under suction and is rotated by a motor (not shown) in the direction shown by an arrow B.

Figure 7:
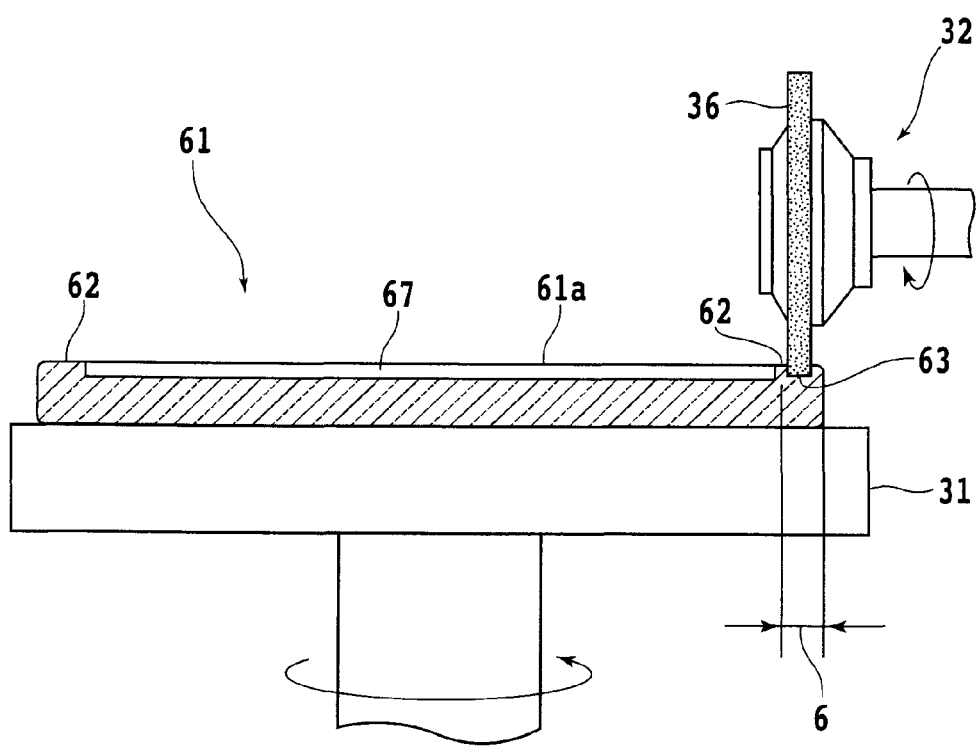
FIG. 7 is a partially sectional side view showing the formation of the annular groove by the cutting apparatus.

As shown in FIG. 7, the rotating cutting blade 36 is first lowered from a position directly above the annular projection 62 of the carrier wafer 61 held on the chuck table 31 until the cutting blade 36 reaches the front side 61a of the carrier wafer 61, i.e., the upper surface of the annular projection 62. Thereafter, the chuck table 31 is rotated by at least 360 degrees. Accordingly, the continuous annular groove 63 is formed on the upper surface of the annular projection 62. The cutting apparatus 30 shown in FIG. 5 further includes an alignment mechanism 37 having an imaging unit 35, a display monitor 38 for displaying an image obtained by the imaging unit 35, and an operation panel 39 for allowing an operator to input necessary information. Accordingly, the cutting apparatus 30 can also perform cutting of the wafer 11 along the division lines 13 shown in FIG. 1.

While the annular groove 63 is formed by using the cutting apparatus 30 shown in FIG. 5 as an embodiment of recess to be formed on the annular projection 62, various other embodiments may be considered. For example, a plurality of vertical holes having bottoms may be formed on the annular projection 62 by using an etching apparatus or any other types of apparatuses. Thus, the recess to be formed on the annular projection 62 is not limited to the annular groove 63 as a specific preferred embodiment.

Thus, the carrier wafer preparing step of preparing the carrier wafer 61 for supporting the front side of the device wafer 11 is performed wherein the carrier wafer 61 includes the recess 67 formed in an area corresponding to the device area 17 of the device wafer 11 and having a depth corresponding to the height of each bump 52, and further includes the annular projection 62 formed in the remaining area corresponding to the peripheral marginal area 19 of the device wafer 11 so as to surround the recess 67, the upper surface of the annular projection 62 being formed with the annular groove 63.

Figure 8:
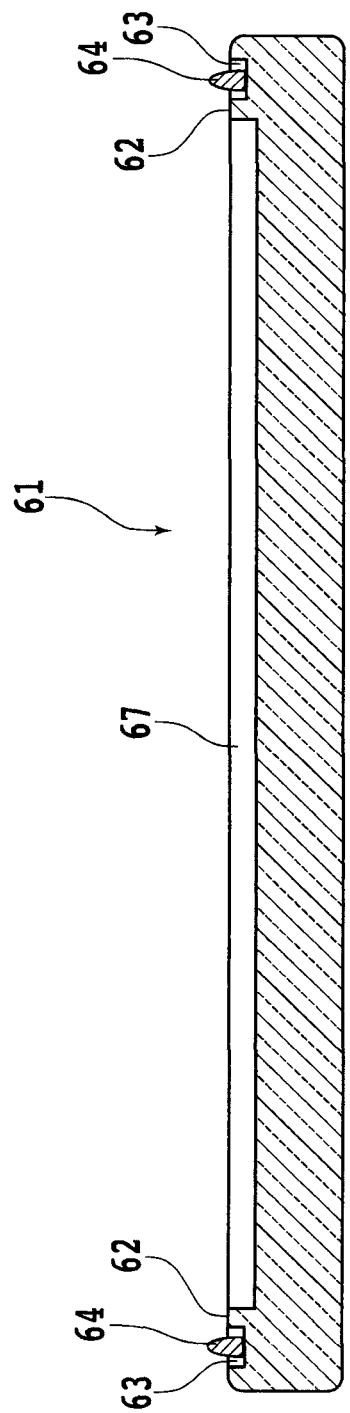
FIG. 8 is a sectional view of the carrier wafer, showing an adhesive providing step.

After performing the carrier wafer preparing step mentioned above, an adhesive providing step is performed in such a manner that an adhesive 64 is provided in the annular groove 63 of the carrier wafer 61 so as to project from the upper surface of the annular projection 62 as shown in FIG. 8. The adhesive 64 is suitably selected according to the material of the carrier wafer 61, and is not especially limited in the present invention. For example, a thermosetting resin such as epoxy adhesive may be used as the adhesive 64. Further, the method of providing the adhesive 64 in the annular groove 63 may be realized by applying the adhesive 64 to the inner surface of the annular groove 63 or by inserting a preliminarily formed annular member as the adhesive 64 into the annular groove 63, for example. Thus, the method of providing the adhesive 64 in the annular groove 63 is not especially limited in the present invention.

In the adhesive providing step, the amount of the adhesive 64 to be provided in the annular groove 63 is preferably set so that the adhesive 64 does not reach the device area 17 of the device wafer 11 in a wafer attaching step to be hereinafter described, i.e., in the condition shown in FIG. 10. In other words, the amount of the adhesive 64 to be provided in the annular groove 63 is preferably set so that the adhesive 64 stays in the peripheral marginal area 19 of the device wafer 11 (or on the annular projection 62 of the carrier wafer 61) in the condition shown in FIG. 10. More preferably, the amount of the adhesive 64 to be provided in the annular groove 63 is set so that the adhesive 64 does not overflow from the annular groove 63 in the condition shown in FIG. 10.

By setting the amount of the adhesive 64 as mentioned above, the adhesive 64 is prevented from reaching the device area 17, so that the deposition of the adhesive 64 to the devices 15 and the bumps 52 can be prevented. In other words, the adhesive 64 can be made to stay in the peripheral marginal area 19 (or on the annular projection 62). In particular, by setting the amount of the adhesive 64 so that the adhesive 64 does not overflow from the annular groove 63, the deposition of the adhesive 64 to the devices 15 and the bumps 52 can be reliably prevented.

In this manner, the adhesive 64 is provided in the annular groove 63 so that the upper end portion of the adhesive 64 projects from the upper surface of the annular projection 62 of the carrier wafer 61. Accordingly, in turning the wafer 11 upside down and next bringing the front side 11a of the wafer 11 into contact with the front side 61a of the carrier wafer 61 as shown in FIG. 9, the peripheral marginal area 19 of the wafer 11 first comes into contact with the adhesive 64 projecting from the annular projection 62 of the carrier wafer 61. As a result, the peripheral marginal area 19 of the wafer 11 is bonded through the adhesive 64 to the annular projection 62 of the carrier wafer 61 in the next step as shown in FIG. 10. At this time, the bumps 52 projecting from the front side 11a of the device wafer 11 are accommodated in the recess 67 of the carrier wafer 61. Since no adhesive is present in the recess 67, there is no possibility of the deposition of adhesive to the bumps 52 and the devices 15.

Figure 10:
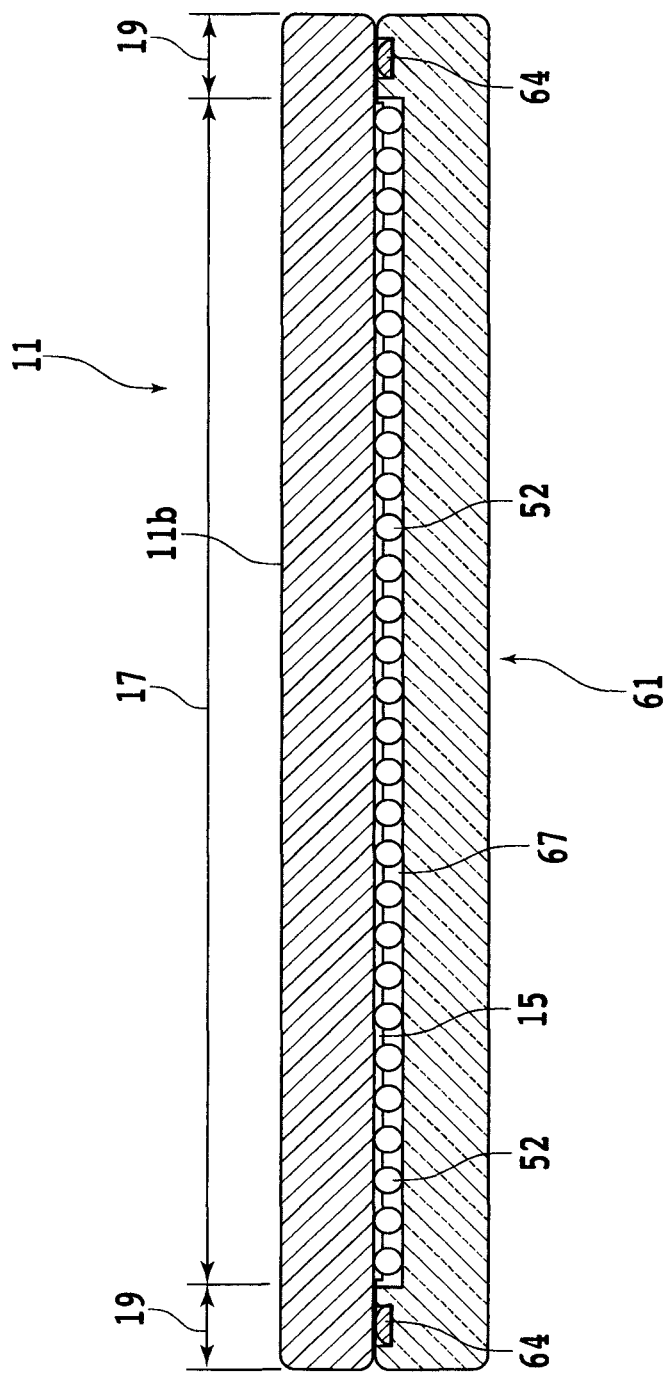
FIG. 10 is a sectional view of the device wafer and the carrier wafer attached together by the wafer attaching step.

After performing the adhesive providing step mentioned above, a wafer attaching step is performed in such a manner that the front side 11a of the device wafer 11 is attached and fixed through the adhesive 64 to the front side 61a of the carrier wafer 61 so as to accommodate the bumps 52 in the recess 67 of the carrier wafer 61 as shown in FIG. 10. After performing the wafer attaching step mentioned above, a thickness reducing step is performed in such a manner that the back side 11b of the device wafer 11 integrated with the carrier wafer 61 is ground or polished to reduce the thickness of the wafer 11 to a predetermined thickness.

Figure 11:
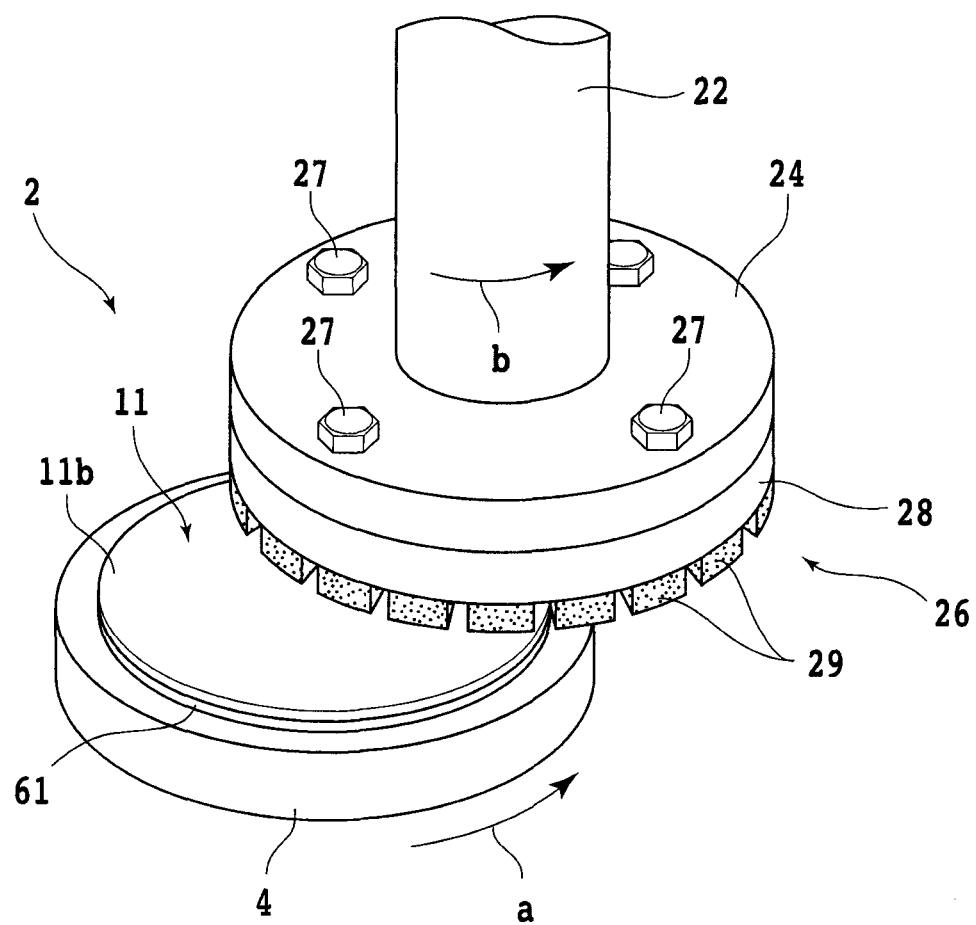
FIG. 11 is a perspective view showing a thickness reducing step.

This thickness reducing step may be performed by using a grinding apparatus 2 shown in FIG. 11. The grinding apparatus 2 includes a spindle 22, a wheel mount 24 fixed to the lower end of the spindle 22, and a grinding wheel 26 mounted on the lower surface of the wheel mount 24 by screws 27. The grinding wheel 26 is composed of an annular base 28 and a plurality of abrasive members 29 fixed to the lower surface of the annular base 28. Each abrasive member 29 is formed by binding diamond abrasive grains having a grain size of 4 to 6 μm with a vitrified bond or a resin bond, for example.

In this thickness reducing step, the device wafer 11 is ground in the condition where it is supported on the carrier wafer 61 having rigidity. Accordingly, it is possible to prevent the occurrence of troubles such as warping of the wafer 11 and chipping of the outer circumferential portion of the wafer 11. Further, the back side of the wafer 11 may be polished after performing the thickness reducing step in order to remove grinding strain produced by the grinding in the thickness reducing step. Further, the peripheral marginal area 19 of the device wafer 11 is held by the annular projection 62 from the lower side of the wafer 11, so that the peripheral marginal area 19 does not float from a holding table 4 (see FIG. 11) in the thickness reducing step. Accordingly, it is possible to prevent damage to the device wafer 11 due to the condition that the peripheral marginal area 19 is not held in the thickness reducing step.

Figure 12:
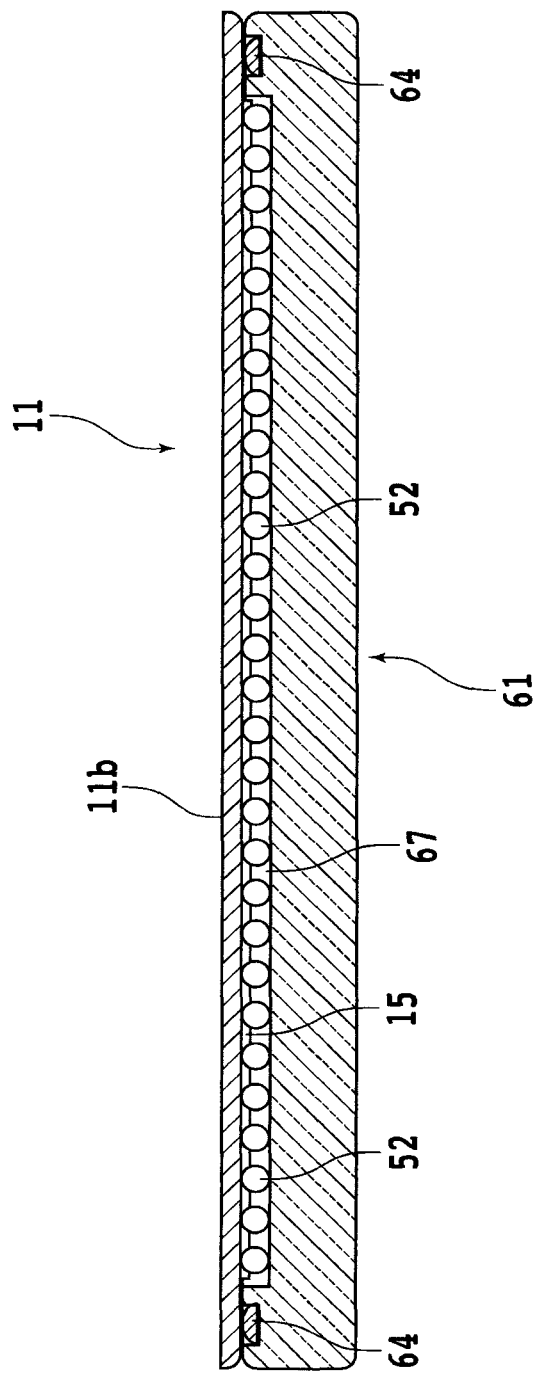
FIG. 12 is a sectional view of the device wafer attached to the carrier wafer after subjected to the thickness reducing step.

Thus, the thickness reducing step is performed to reduce the thickness of the device wafer 11 to a predetermined thickness by grinding or polishing the back side 11b as shown in FIG. 12. The device wafer 11 thus reduced in thickness is integrated with the carrier wafer 61. Therefore, after performing the thickness reducing step, a separating step of separating the device wafer 11 from the carrier wafer 61 is performed. This separating step is performed by using the cutting unit 32 as shown in FIG. 13 as in the case of forming the annular groove 63 in the carrier wafer preparing step mentioned above.

Figure 13:
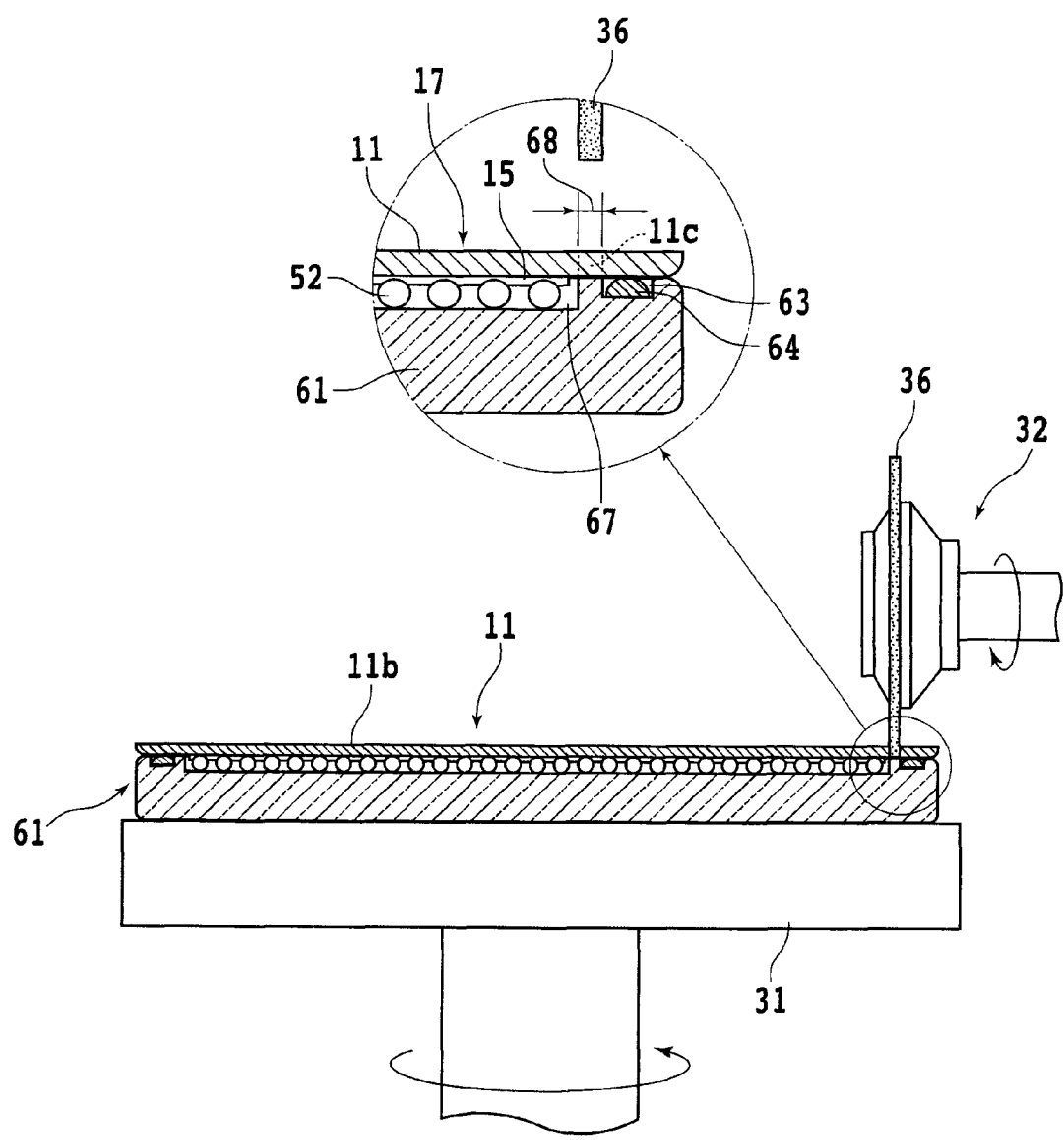
FIG. 13 is a partially sectional side view for illustrating a separating step.

More specifically, after performing the thickness reducing step, the cutting blade 36 is positioned directly above a portion 11c of the device wafer 11 corresponding to a boundary area 68 between the inner circumference of the annular groove 63 of the carrier wafer 61 and the outer circumference of the recess 67 of the carrier wafer 61 as shown in an enlarged (encircled) part of FIG. 13. Thereafter, the rotating cutting blade 36 is lowered to cut the device wafer 11 along the portion 11c as rotating the chuck table 31 as shown in FIG. 13, thereby separating the device area 17 of the device wafer 11 from the carrier wafer 61.

Accordingly, the device wafer 11 is separated into the inside portion including the device area 17 and the outside portion not including the device area 17 along the portion 11c as a boundary where the wafer 11 is cut by the cutting blade 36. As a result, the inside portion including the device area 17 can be separated from the carrier wafer 61. In the device wafer 11 (the inside portion including the device area 17) separated from the carrier wafer 61, no adhesive is deposited on the bumps 52 and the devices 15, so that there is no possibility of device failure due to the deposition of adhesive. Thereafter, the device wafer 11 separated from the carrier wafer 61 is divided into the individual devices 15 (see FIG. 1) along the division lines 13 (see FIG. 1) by using a cutting apparatus or a laser processing apparatus.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for a bump-included device wafer having a device area where a plurality of devices are formed and a peripheral marginal area surrounding said device area, said devices being respectively formed in a plurality of regions partitioned by a plurality of crossing division lines formed on a front side of said device wafer, each device having a plurality of bumps, said processing method comprising:

a carrier wafer preparing step of preparing a carrier wafer for supporting the front side of said device wafer, wherein said carrier wafer includes a recess formed in an area corresponding to said device area of said device wafer and having a depth corresponding to a height of each bump, and further includes an annular projection formed in a remaining area corresponding to said peripheral marginal area of said device wafer so as to surround said recess, an upper surface of said annular projection being formed with an annular groove;

an adhesive providing step of providing an adhesive in said annular groove of said carrier wafer so that said adhesive projects from the upper surface of said annular projection after performing said carrier wafer preparing step;

a wafer attaching step of attaching and fixing the front side of said device wafer through said adhesive to a front side of said carrier wafer so as to accommodate said bumps in said recess of said carrier wafer after performing said adhesive providing step; and a thickness reducing step of grinding or polishing a back side of said device wafer to reduce the thickness of said device wafer to a predetermined thickness after performing said wafer attaching step.

2. The processing method for the bump-included device wafer according to claim 1, further comprising a separating step of cutting said device wafer along a portion thereof corresponding to a boundary area between an inner circumference of said annular groove of said carrier wafer and an outer circumference of said recess of said carrier wafer by using a cutting blade, thereby separating said device area of said device wafer from said carrier wafer after performing said thickness reducing step.

* * * * *